US011495576B2

(12) United States Patent
Kim et al.

(10) Patent No.: US 11,495,576 B2
(45) Date of Patent: Nov. 8, 2022

(54) SEMICONDUCTOR PACKAGE

(71) Applicant: Samsung Electronics Co., Ltd., Suwon-si (KR)

(72) Inventors: Kyoungsoo Kim, Hwaseong-si (KR); Sunwon Kang, Seongnam-si (KR); Seungduk Baek, Hwaseong-si (KR); Ho Geon Song, Suwon-si (KR); Kyung Suk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 93 days.

(21) Appl. No.: 16/822,693

(22) Filed: Mar. 18, 2020

(65) Prior Publication Data

US 2021/0005576 A1   Jan. 7, 2021

(30) Foreign Application Priority Data

Jul. 3, 2019   (KR) .......................... 10-2019-0079995

(51) Int. Cl.
| | |
|---|---|
| *H01L 23/498* | (2006.01) |
| *H01L 23/48* | (2006.01) |
| *H01L 23/544* | (2006.01) |
| *H01L 25/065* | (2006.01) |
| *H01L 23/00* | (2006.01) |
| *H01L 25/00* | (2006.01) |

(52) U.S. Cl.
CPC .......... *H01L 25/0657* (2013.01); *H01L 24/16* (2013.01); *H01L 24/17* (2013.01); *H01L 25/50* (2013.01); *H01L 2224/16146* (2013.01); *H01L 2224/17181* (2013.01); *H01L 2225/06513* (2013.01); *H01L 2225/06541* (2013.01); *H01L 2225/06565* (2013.01)

(58) Field of Classification Search
CPC ........... H01L 2225/06541; H01L 2224/13025
See application file for complete search history.

(56) References Cited

U.S. PATENT DOCUMENTS

| | | | |
|---|---|---|---|
| 6,650,014 B2 | 11/2003 | Kariyazaki | |
| 6,919,227 B2 | 7/2005 | Nishiyama | |
| 7,361,997 B2 * | 4/2008 | Yashiro | ................... H01L 23/50 |
| | | | 257/786 |
| 8,749,027 B2 * | 6/2014 | Chen | ..................... H01L 23/585 |
| | | | 257/621 |

(Continued)

FOREIGN PATENT DOCUMENTS

JP   2016157844   9/2016

*Primary Examiner* — Bradley Smith
*Assistant Examiner* — David J Goodwin
(74) *Attorney, Agent, or Firm* — Myers Bigel, P.A.

(57) ABSTRACT

A semiconductor package includes a first die including a signal region and a peripheral region bordering the signal region and having first vias in the peripheral region, a second die stacked on the first die and having second vias at positions corresponding to the first vias in the peripheral region, and first connection terminals between the first die and the second die that are configured to connect the second vias to the first vias, respectively. The peripheral region includes first regions and second regions configured to transmit different signals, which are alternately arranged in a first direction. The first vias are arranged in at least two rows along a second direction intersecting the first direction in each of the first and second regions.

19 Claims, 12 Drawing Sheets

(56) References Cited

U.S. PATENT DOCUMENTS

| | | |
|---|---|---|
| 9,099,318 B2 | 8/2015 | Chen |
| 9,147,643 B2 * | 9/2015 | You ................... H01L 23/49827 |
| 9,252,091 B2 * | 2/2016 | Ide ........................ H01L 23/481 |
| 9,761,564 B1 * | 9/2017 | Shibata ............... G11C 11/4091 |
| 9,991,221 B2 | 6/2018 | Yamada et al. |
| 2012/0164788 A1 * | 6/2012 | Ide ..................... H01L 25/0657 |
| | | 438/109 |
| 2012/0292777 A1 * | 11/2012 | Lotz ....................... H01L 24/06 |
| | | 257/774 |
| 2013/0228898 A1 * | 9/2013 | Ide ......................... H01L 25/18 |
| | | 257/621 |
| 2016/0064357 A1 * | 3/2016 | Choe .................... H01L 23/481 |
| | | 257/774 |
| 2018/0012867 A1 * | 1/2018 | Kim ....................... G11C 5/063 |
| 2018/0150588 A1 | 5/2018 | Bader et al. |
| 2020/0111764 A1 * | 4/2020 | Kim .................... H01L 23/5386 |
| 2021/0175218 A1 * | 6/2021 | Choi .................... H01L 25/105 |

* cited by examiner

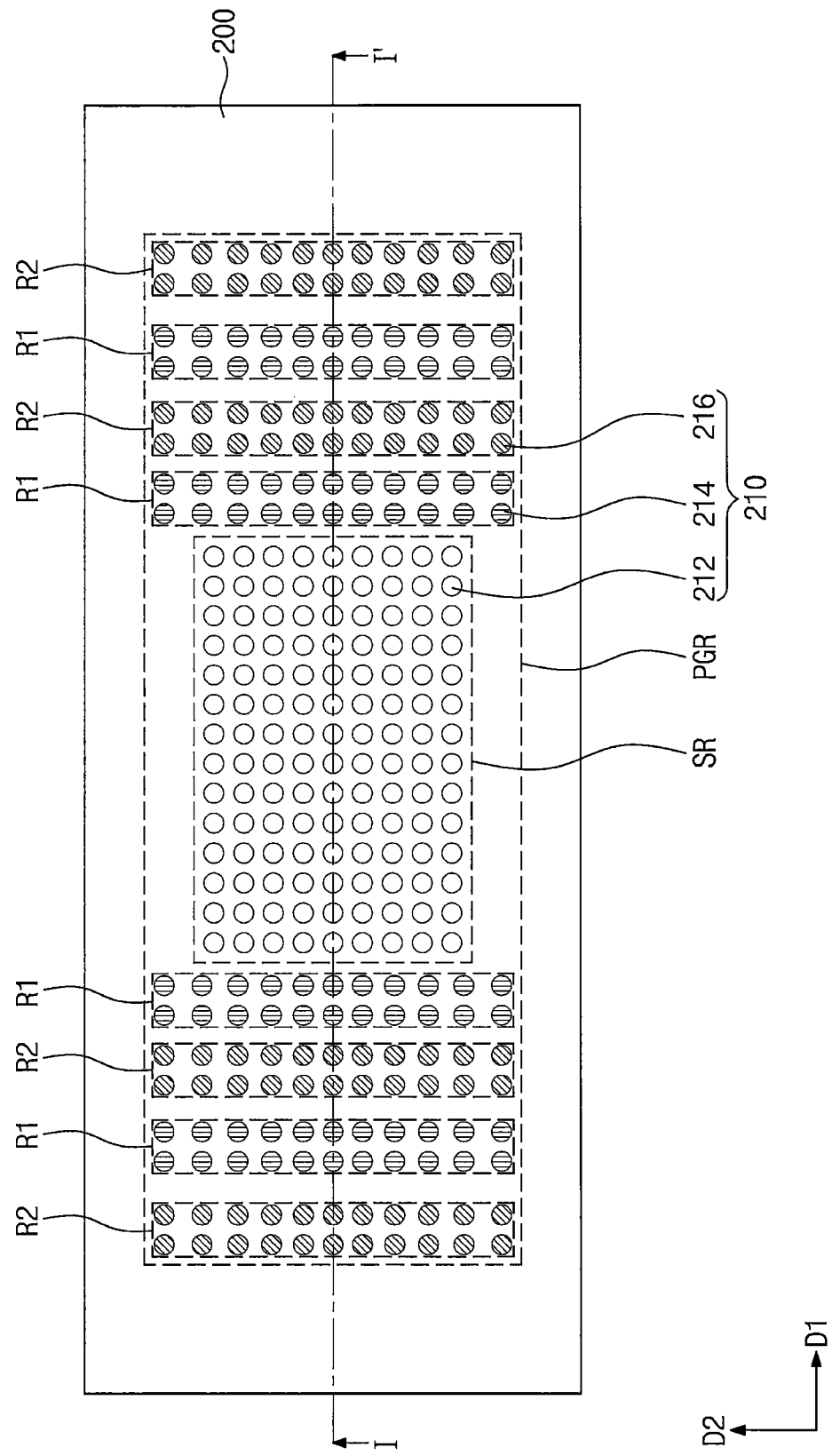

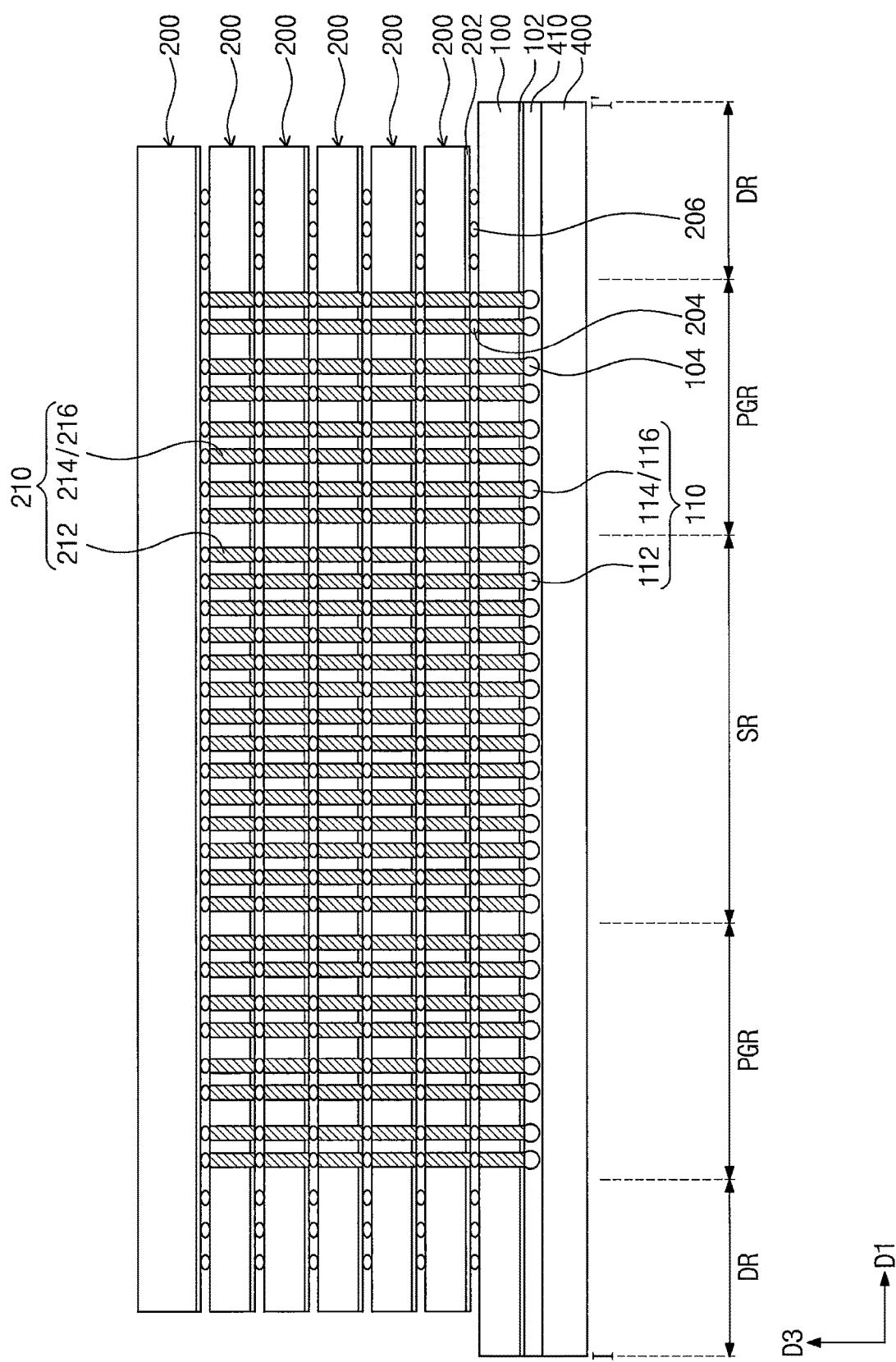

SEMICONDUCTOR PACKAGE

CROSS-REFERENCE TO RELATED APPLICATION

This U.S. non-provisional patent application claims priority under 35 U.S.C. § 119 to Korean Patent Application No. 10-2019-0079995, filed on Jul. 3, 2019, in the Korean Intellectual Property Office, the disclosure of which is hereby incorporated by reference in its entirety.

BACKGROUND

Embodiments of the inventive concepts relate to a semiconductor package and, more particularly, to a stack-type semiconductor package.

Light, small, high-speed, high-performance, and low-cost electronic products may be provided as the electronic industry develops. An integrated circuit chip may be realized in the form of a semiconductor package so as to be applied to or used in an electronic product as appropriate. Various techniques for improving the performance of a semiconductor package have been studied. In particular, in response to an increase in demand for high-performance semiconductor packages, a through-silicon-via (TSV) technique has been developed to replace a typical wire bonding technique.

SUMMARY

Embodiments of the inventive concepts may provide a semiconductor package capable of reducing or minimizing electrical failure caused by misalignment.

In some embodiments, a semiconductor package may comprise a first die comprising a signal region and a peripheral region bordering the signal region, the first die having first vias in the peripheral region, a second die stacked on the first die and having second vias at positions corresponding to the first vias in the peripheral region, and first connection terminals between the first die and the second die that are configured to connect the second vias to the first vias, respectively. The peripheral region may comprise first regions and a second region between the first regions, and the first and second regions may be arranged in a first direction at a side of the signal region. The first vias may be arranged in at least two rows along a second direction intersecting the first direction in each of the first and second regions, and a distance in the first direction between the first and the second regions adjacent to each other may be greater than a distance in the first direction between adjacent ones of the rows.

In some embodiments, a semiconductor package may include a substrate including first regions and second regions alternately arranged in a first direction, and dies stacked on the substrate. Each of the dies may include power vias in the first regions, and ground vias in the second regions. The power vias may be arranged in multiple rows along a second direction intersecting the first direction in each of the first regions, and the ground vias may be arranged in multiple rows along the second direction in each of the second regions. A distance in the second direction between adjacent ones of the power vias in a same one of the multiple rows and a distance in the second direction between adjacent ones of the ground vias in a same one of the multiple rows in each of the dies may increase as a distance from an outer edge of each of the dies decreases, when viewed in a plan view.

In some embodiments, a semiconductor package may include a substrate, and dies vertically stacked on the substrate. Each of the dies may include first vias and second vias, which vertically penetrate each of the dies. The first vias may be in a first region of the substrate, and the first vias may be arranged in at least two rows along a second direction intersecting a first direction. The second vias may be in a second region of the substrate which is spaced apart from the first region in the first direction, and the second vias may be arranged in at least two rows along the second direction. A distance in the first direction between the first and second regions adjacent to each other may range from about 110% to about 200% of a distance in the first direction between adjacent ones of the at least two rows of the first vias and may range from about 110% to about 200% of a distance in the first direction between adjacent ones of the at least two rows of the second vias.

BRIEF DESCRIPTION OF THE DRAWINGS

The inventive concepts will become more apparent in view of the attached drawings and accompanying detailed description.

FIG. 3B is a plan view illustrating a method for manufacturing a semiconductor package according to some embodiments of the inventive concepts.

FIG. 5 is a cross-sectional view illustrating a method for manufacturing a semiconductor package according to some embodiments of the inventive concepts.

DETAILED DESCRIPTION OF THE EMBODIMENTS

Figure 1:
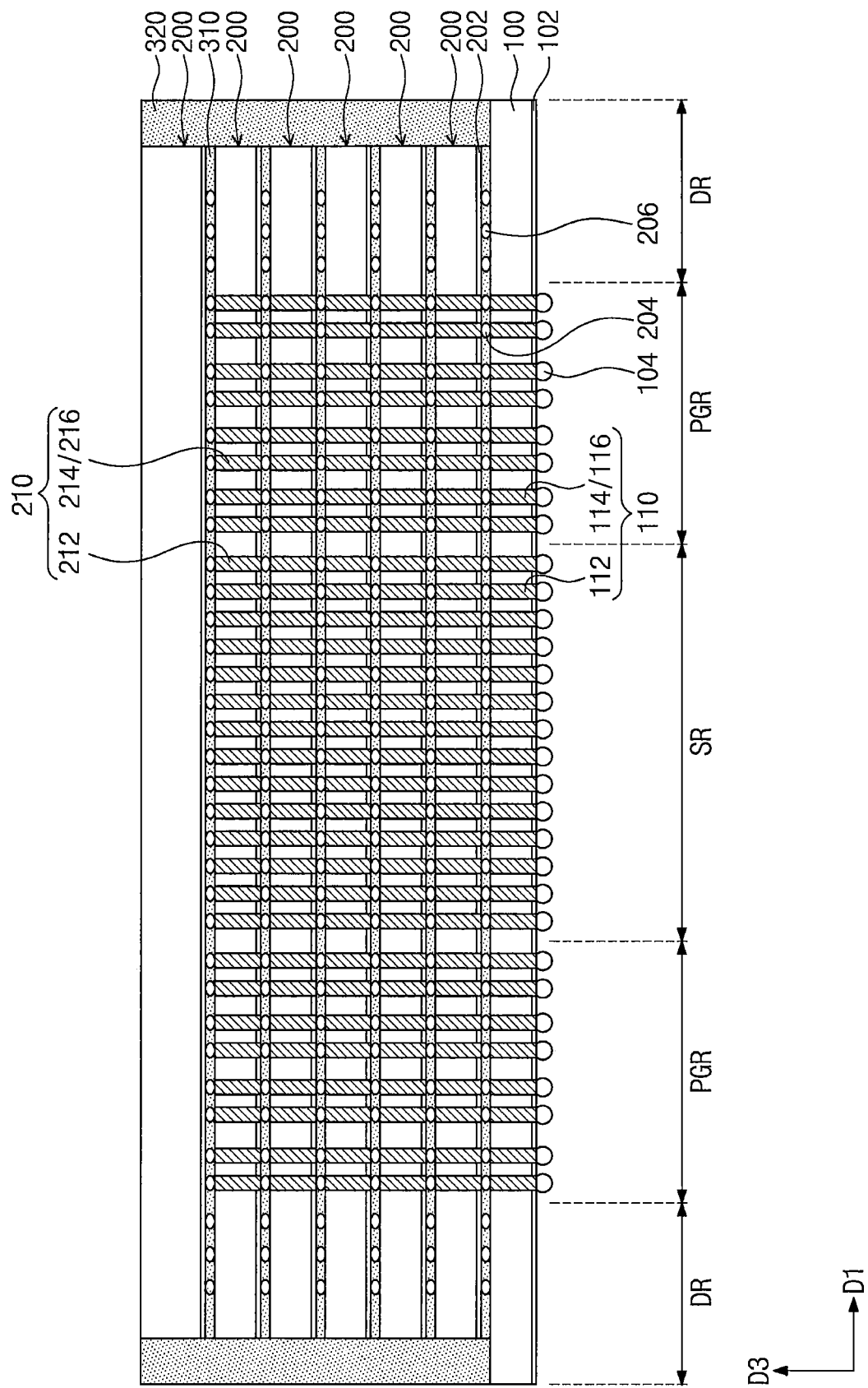
FIG. 1 is a cross-sectional view illustrating a semiconductor package according to some embodiments of the inventive concepts.

Hereinafter, example embodiment of the present inventive concept will be described in detail with reference to the accompanying drawings. The same reference numerals are used for the same constituent elements in the drawings, and redundant description of the same constituent elements will be omitted.

As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

A semiconductor package and a method for manufacturing the same according to embodiments of the inventive concepts will be described hereinafter with reference to the accompanying drawings.

FIG. 1 is a cross-sectional view illustrating a semiconductor package according to some embodiments of the inventive concepts. As illustrated in FIG. 1, a semiconductor package, according to some embodiments of the inventive concepts, may be a stack-type package using vias. For example, the same or similar kind of second dies 200 may be stacked on a first die 100, and the second dies 200 may be electrically connected to each other through vias 210 penetrating the second dies 200. The second dies 200 may be connected to each other by using bumps 204 provided on their bottom surfaces. For example, in some embodiments, the second dies 200 may be in the form of a micro pillar grid array (MPGA). Detailed components of the semiconductor package, according to some embodiments of the inventive concepts, will be described together with a method for manufacturing the semiconductor package.

Figure 2A:
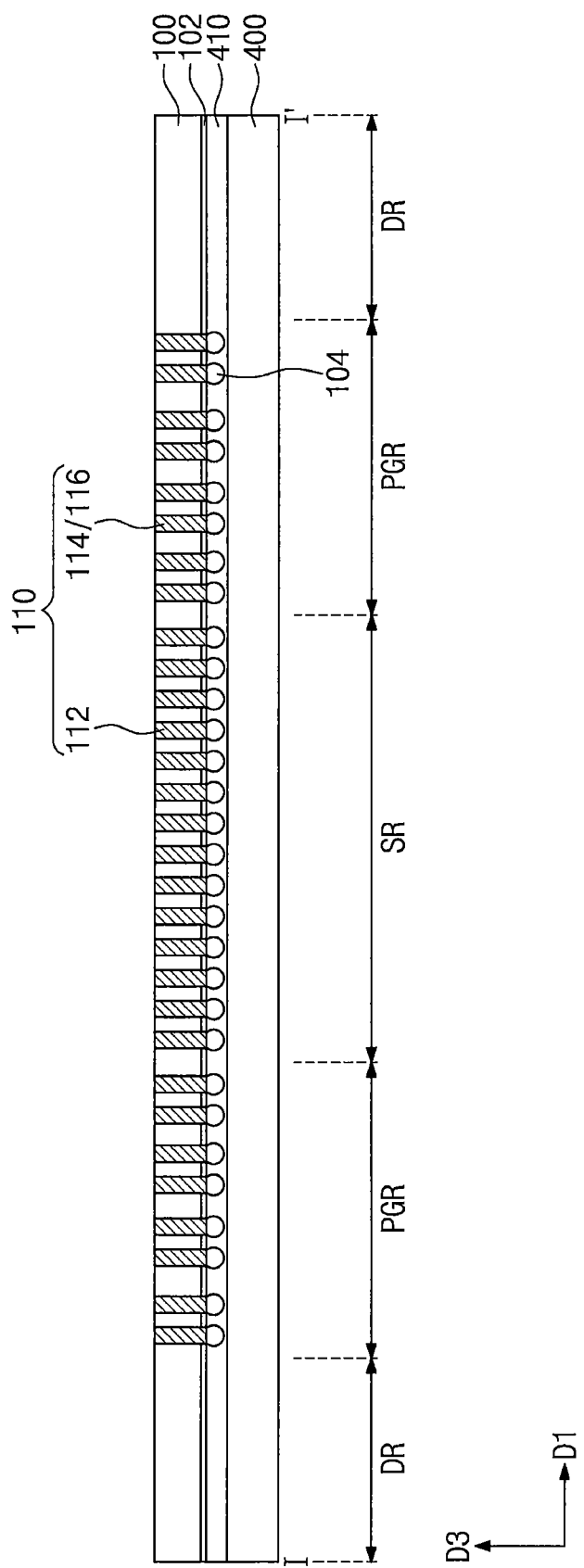
FIG. 2A is a cross-sectional view illustrating a method for manufacturing a semiconductor package according to some embodiments of the inventive concepts.
Figure 2B:
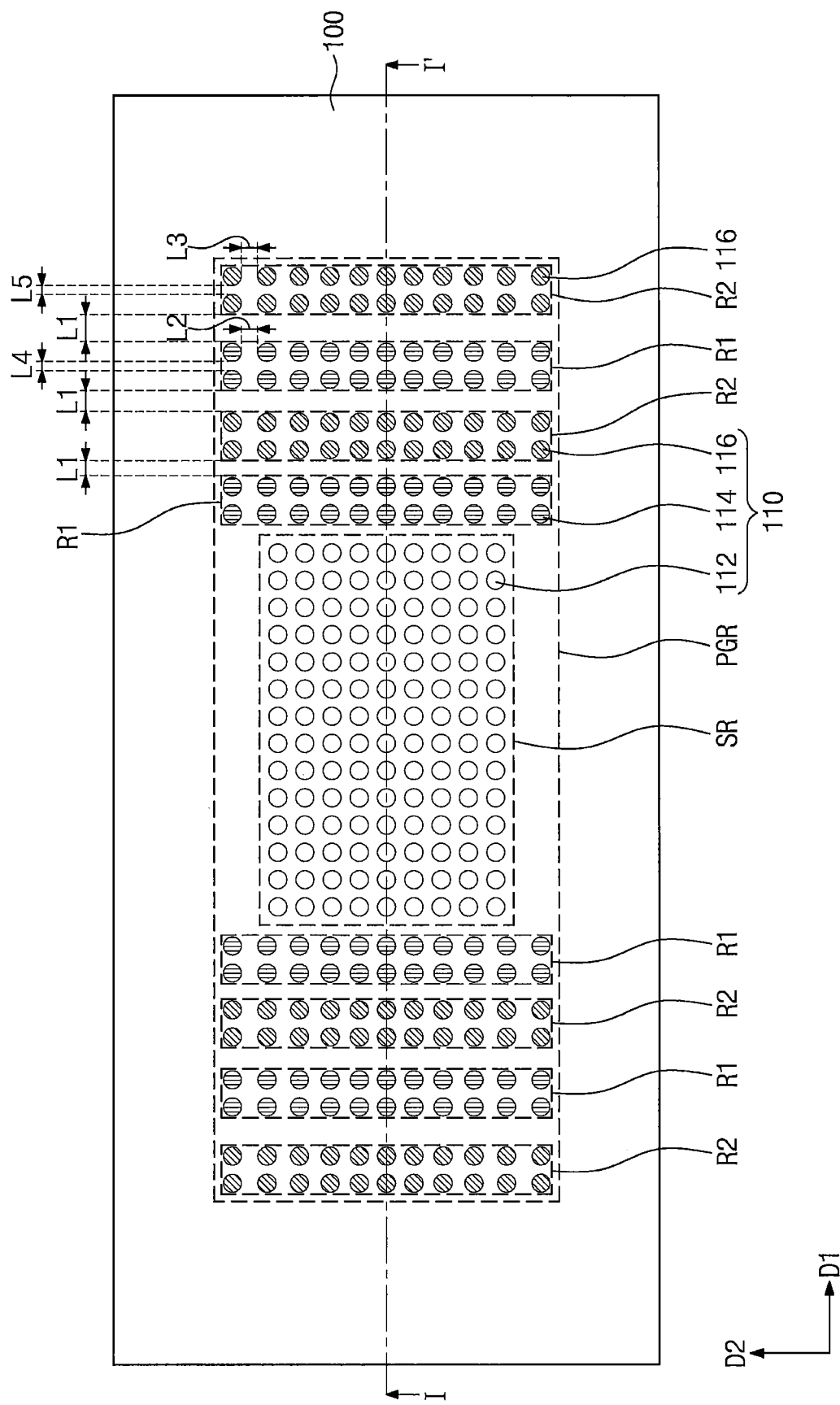
FIGS. 2B-2D are plan views illustrating a method for manufacturing a semiconductor package according to some embodiments of the inventive concepts.
Figure 2C:
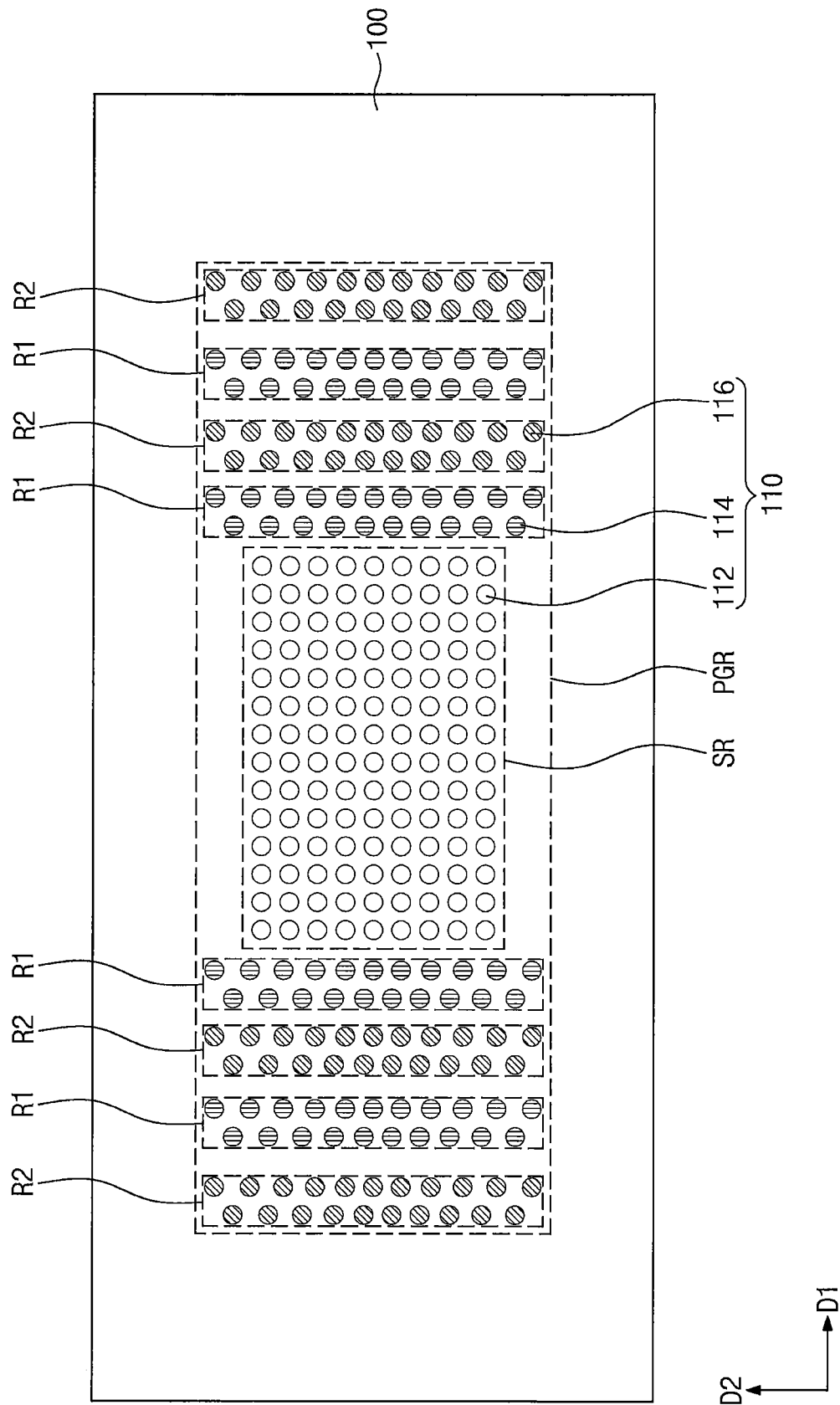
Figure 2D:
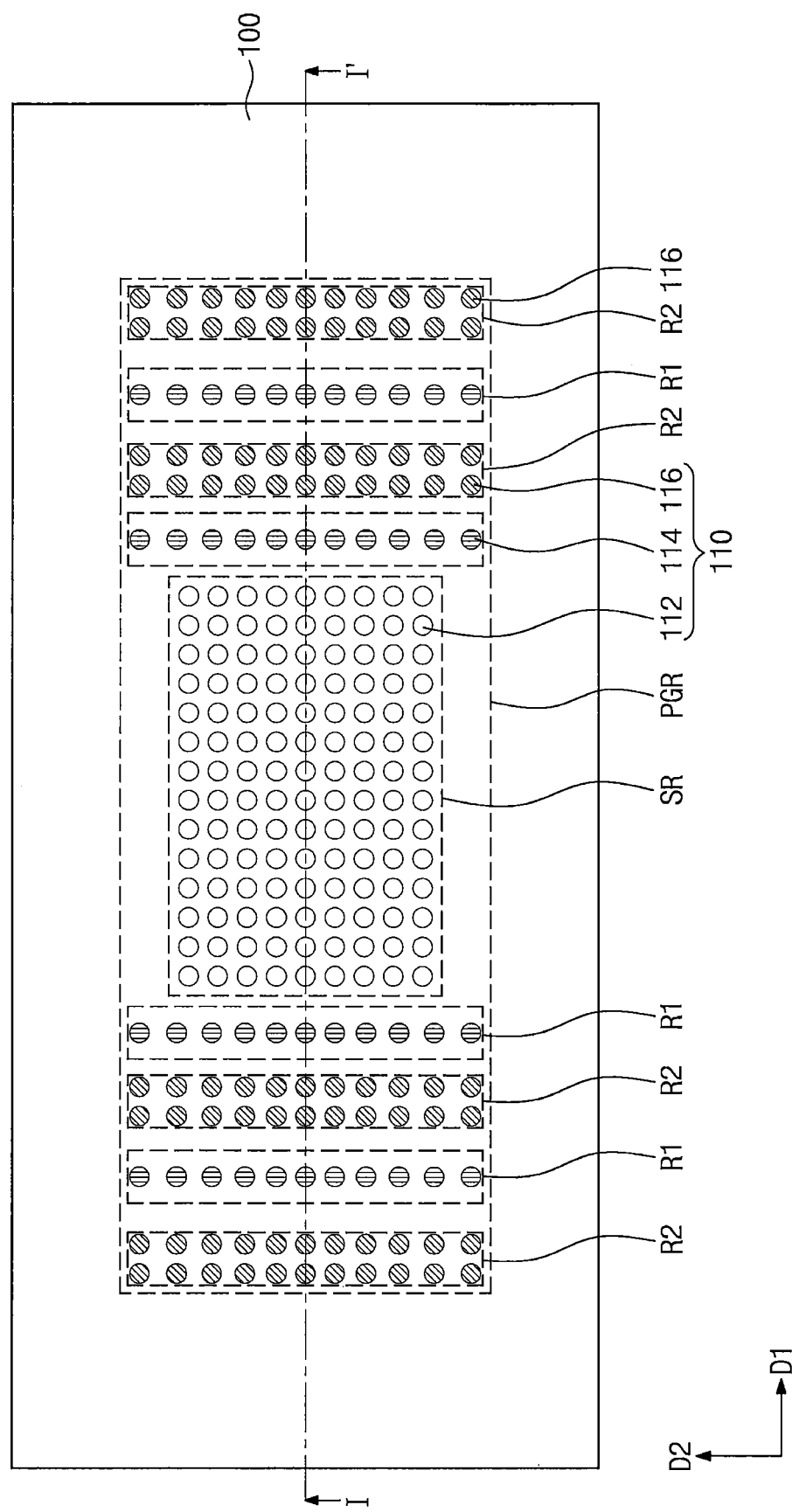
Figure 3A:
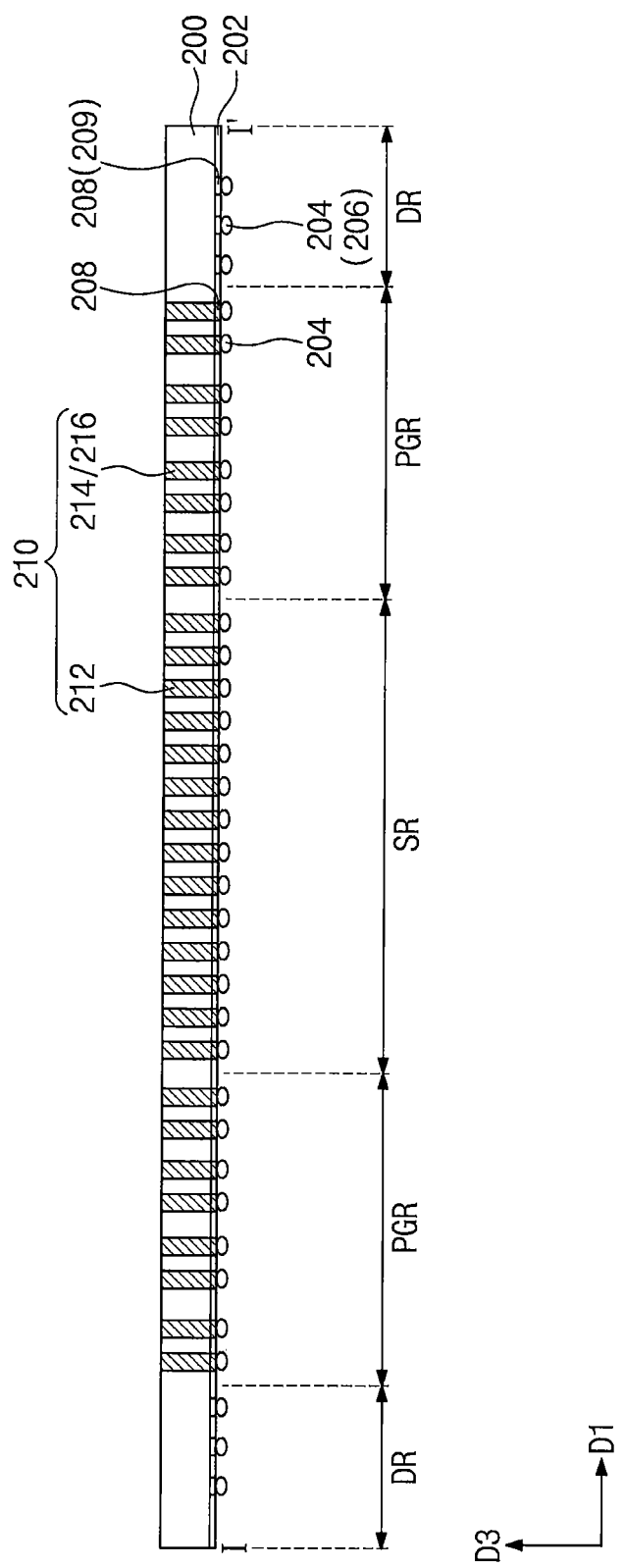
FIG. 3A is a cross-sectional view illustrating a method for manufacturing a semiconductor package according to some embodiments of the inventive concepts.
Figure 4A:
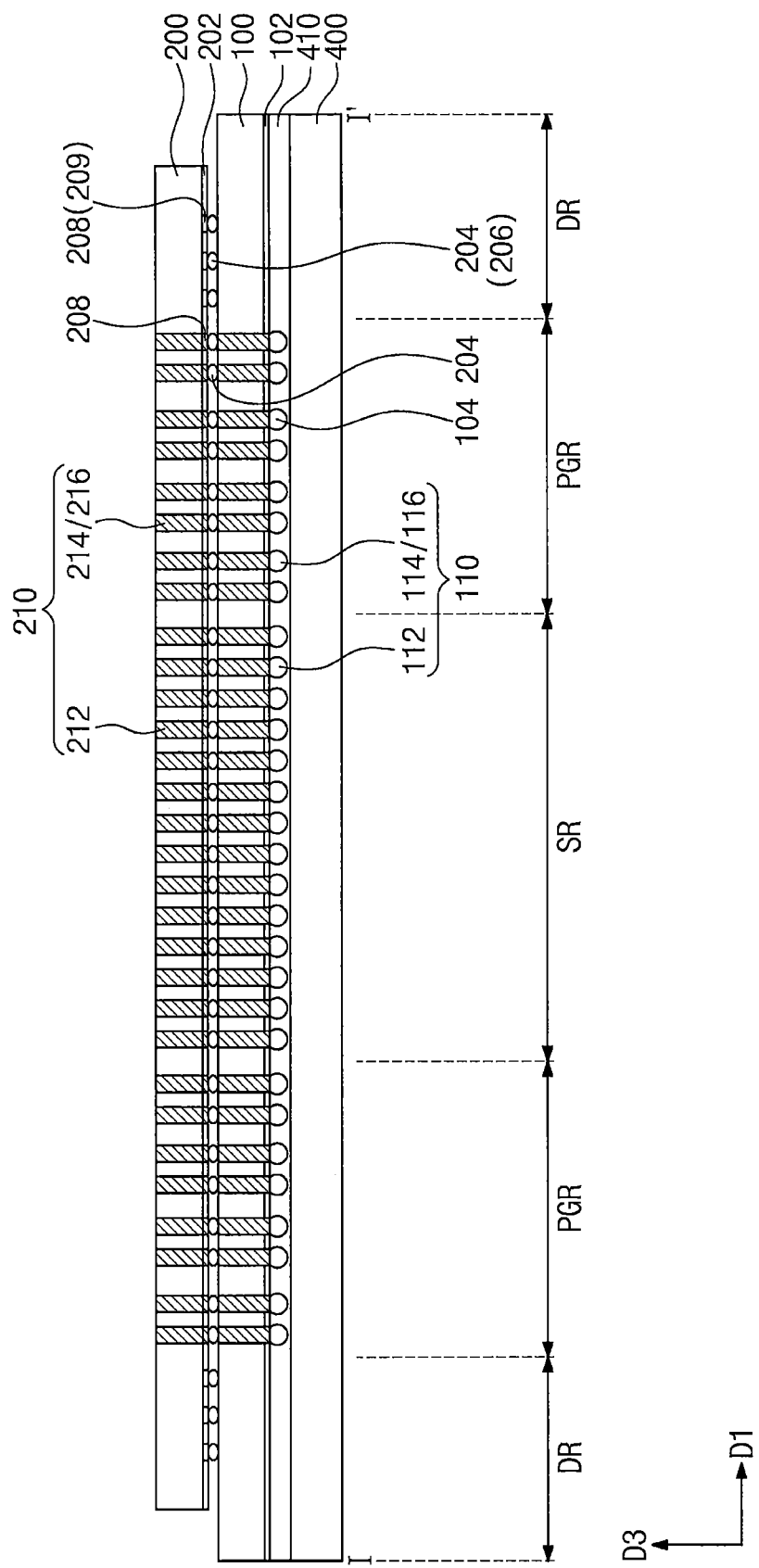
FIG. 4A is a cross-sectional view illustrating a method for manufacturing a semiconductor package according to some embodiments of the inventive concepts.
Figure 4B:
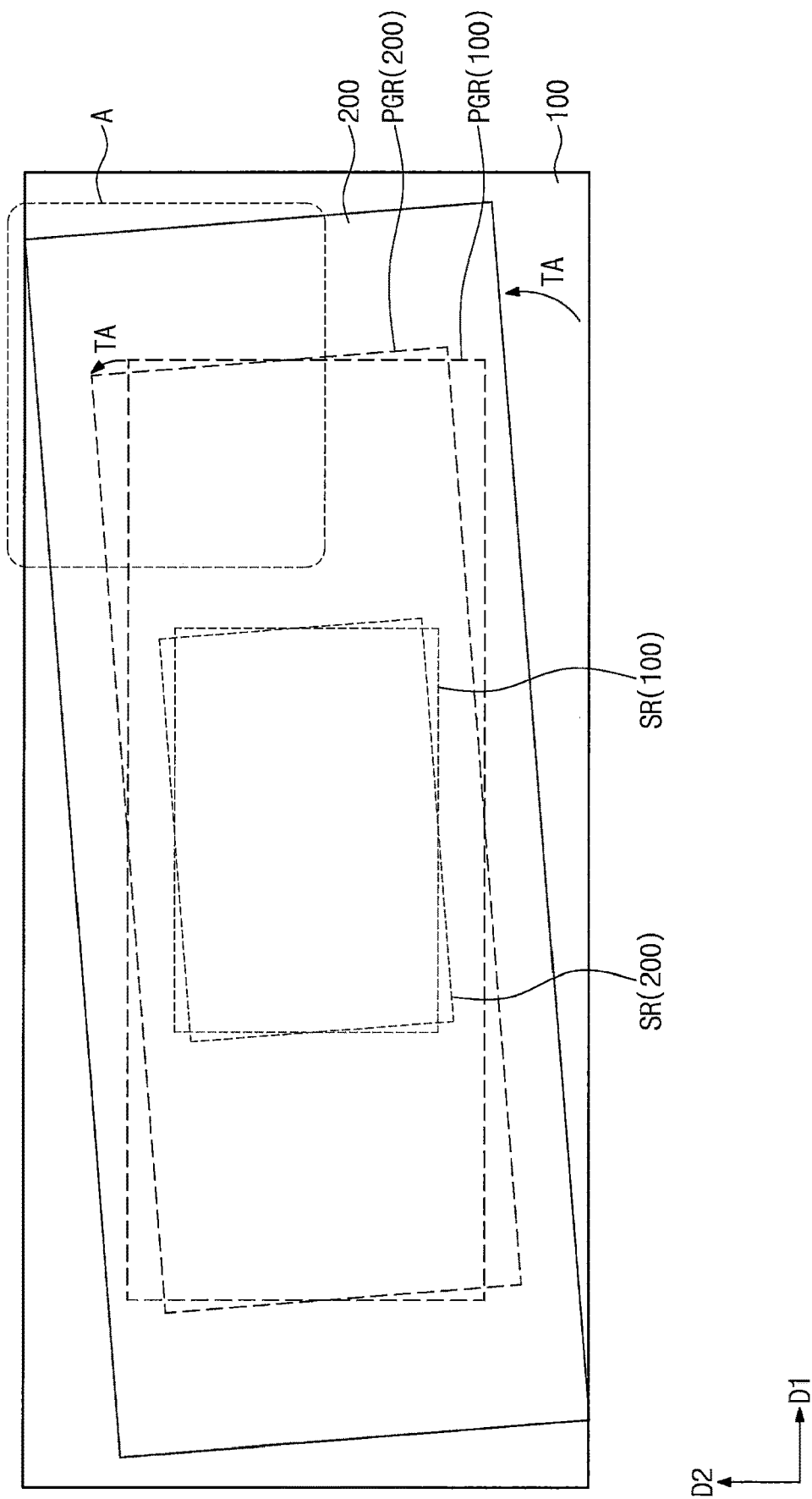
FIG. 4B is a plan view illustrating a method for manufacturing a semiconductor package according to some embodiments of the inventive concepts.

Hereinafter, a method for manufacturing a semiconductor package according to some embodiments of the inventive concepts will be described with reference to the drawings. FIGS. 2A, 3A, 4A, and 5 are cross-sectional views illustrating a method for manufacturing a semiconductor package according to some embodiments of the inventive concepts. FIGS. 2B, 3B, and 4B are plan views illustrating a method for manufacturing a semiconductor package according to some embodiments of the inventive concepts. FIGS. 2A, 3A, and 4A correspond to cross-sectional views taken along lines I-I' of FIGS. 2B, 3B, and 4B, respectively, and correspond to substantially the same cross-sectional view as FIG. 1. FIGS. 2C and 2D are plan views illustrating a method for manufacturing a semiconductor package, according to some embodiments of the inventive concepts, and illustrate other examples of arrangement of first vias of a first die.

Hereinafter, a first direction D1 and a second direction D2 may be defined as directions that are parallel to a top surface of the first die 100 and are perpendicular to each other, and a third direction D3 may be defined as a direction perpendicular to the top surface of the first die 100. Here, the first direction D1 may be a long-axis direction of the first die 100 and the second direction D2 may be a short-axis direction of the first die 100 when viewed in a plan view.

Referring to FIGS. 1, 2A and 2B, a base substrate 100 may be provided on a carrier substrate 400. For example, the base substrate 100 may be adhered to the carrier substrate 400 by a carrier adhesive layer 410.

The base substrate 100 may include an integrated circuit therein. In some embodiments, the base substrate 100 may be a first die including electronic elements, such as transistors. For example, the base substrate 100 may be a semiconductor die in a wafer level or form, which is formed of a semiconductor material, such as silicon (Si). In FIG. 1, the base substrate 100 is the first die. However, embodiments of the inventive concepts are not limited thereto. In other embodiments, the base substrate 100 may be a substrate that does not include an electronic element, such as a transistor. Hereinafter, the base substrate 100 and the first die 100 will be described as the same component.

The first die 100 may include a signal region SR located in a central portion of the first die 100, a peripheral region PGR at least partially surrounding or bordering the signal region SR, and a dummy region DR at least partially surrounding or bordering the peripheral region PGR, when viewed in a plan view. The signal region SR may be a region in which interconnection lines for signals processed in the integrated circuit in the first die 100 are provided, and the peripheral region PGR may be a region in which interconnection lines for various signals for driving the integrated circuit in the first die 100 are provided. An interconnection line electrically connected to the integrated circuit in the first die 100 may not be provided in the dummy region DR. The peripheral region PGR may include first regions R1 and second regions R2, which are disposed at each side in the first direction D1 of the signal region SR. The first regions R1 and the second regions R2 may be alternately arranged in the first direction D1. Interconnection lines for different signals may be provided in the first regions R1 and the second regions R2, respectively. For example, a power circuit for a power signal may be provided in the first regions R1, and a ground circuit for a ground signal may be provided in the second regions R2. A distance L1 between the first region R1 and the second region R2 adjacent to each other may increase as a distance from the signal region SR in the first direction D1 increases.

The first die 100 may include a first circuit layer 102 and first vias 110.

The first circuit layer 102 may be provided on a bottom surface of the first die 100. The first circuit layer 102 may include the integrated circuit. For example, the first circuit layer 102 may include a memory circuit, a logic circuit, or a combination thereof. In other words, the bottom surface of the first die 100 may be an active surface.

The first vias 110 may penetrate the first die 100 in the third direction D3. The first vias 110 may be electrically connected to the first circuit layer 102. The first vias 110 may include first signal vias 112 provided in the signal region SR, first power vias 114 provided in the first regions R1, and first ground vias 116 provided in the second regions R2. The first power vias 114 may be electrically connected to a power circuit of the first regions R1 of the first die 100. The first ground vias 116 may be electrically connected to a ground circuit of the second regions R2. The first power vias 114 and the first ground vias 116 may be electrically insulated from the first signal vias 112. Since the first power vias 114 and the first ground vias 116 are provided in the regions R1 and R2 different from each other, the first power vias 114 and the first ground vias 116 may be grouped. According to the embodiments of the inventive concepts, because the first power vias 114 and the first ground vias 116 are grouped, electrical failures may be reduced or minimized when second dies 200, described below, are stacked on the first die 100 (see FIGS. 3A, 3B, 4A, and 4B). This will be described below in detail together with a process of stacking the second dies 200 on the first die 100.

The first power vias 114 may be arranged in multiple rows along the second direction D2 in one of the first regions R1. For example, as illustrated in FIG. 2B, the first power vias 114 may be provided in a grid form. In FIG. 2B, the first power vias 114 are arranged in two rows along the second direction D2. In other embodiments, the first power vias 114 may be arranged in three or more rows. In some embodiments, the first power vias 114 arranged in different numbers of rows may be provided in the first regions R1, respectively, as desired. For example, one of the first regions R1 may have the first power vias 114 arranged in two rows, and another of the first regions R1 may have the first power vias 114 arranged in three or more rows. When a large number of the first power vias 114 are configured, the first power vias 114 arranged in a large number of rows may be provided in one or some of the first regions R1 as described above. Hereinafter, the embodiments of FIG. 2B will be described as examples.

In other embodiments, as illustrated in FIG. 2C, the rows, each of which includes the first power vias 114 arranged in the second direction D2, may be shifted or offset from each other in the second direction D2. For example, the first power vias 114 of the first region R1 may be arranged in a zigzag form along the second direction D2. Centers of three first power vias 114 closest to each other may form an equilateral triangle shape. Unlike FIG. 2C, the first power vias 114 may be arranged in three or more rows in the first region R1. In this case, the first power vias 114 may be arranged in a honeycomb form. When the rows of the first power vias 114 are shifted or offset from each other as described above, a distance between the rows of the first power vias 114 may be less than a distance between individual ones of the first power vias 114, for example, less than a distance in the D2 direction of individual ones of the first power vias in a same row. In other words, an area of the first region R1 in which the first power vias 114 are provided may be reduced while securing a desired distance between the first power vias 114.

The first ground vias 116 may be arranged in multiple rows along the second direction D2 in one of the second regions R2. For example, as illustrated in FIG. 2B, the first ground vias 116 may be provided in a grid form. In some embodiments, the first ground vias 116 may be arranged in three or more rows. In other embodiments, the first ground vias 116 may be arranged in different numbers of rows in the second regions R2, respectively, as necessary. For example, one of the second regions R2 may have the first ground vias 116 arranged in two rows, and another of the second regions R2 may have the first ground vias 116 arranged in three or more rows. When a large number of the first ground vias 116 are configured, the first ground vias 116 may be arranged in a large number of rows in one or some of the second regions R2 as described above. Hereinafter, the embodiments of FIG. 2B will be described as examples.

In other embodiments, as illustrated in FIG. 2C, the rows, each of which includes the first ground vias 116 arranged in the second direction D2, may be shifted or offset from each other in the second direction D2. For example, the first ground vias 116 of the second region R2 may be arranged in a zigzag form along the second direction D2. In some embodiments, the first ground vias 116 may be arranged in three or more rows.

Distances L2 and L4 between the first power vias 114 and distances L3 and L5 between the first ground vias 116 may be greater than the distance between adjacent ones of the first signal vias 112 in the first direction D1 and the distance between adjacent ones of the first signal vias 112 in the second direction D2.

The distance L1 between the first region R1 and the second region R2 adjacent to each other may be greater than the distance L4 between the first power vias 114 in the first direction D1 and the distance L5 between the first ground vias 116 in the first direction D1. In some embodiments, the distance L1 between the first region R1 and the second region R2 adjacent to each other may range from about 110% to 200% of the distance L4 between the first power vias 114 in the first direction D1 and may range from about 110% to 200% of the distance L5 between the first ground vias 116 in the first direction D1.

In addition, the distance L1 between the first region R1 and the second region R2 adjacent to each other may be greater than the distance L2 between the first power vias 114 in the second direction D2 and the distance L3 between the first ground vias 116 in the second direction D2. In some embodiments, the distance L1 between the first region R1 and the second region R2 adjacent to each other may range from about 110% to 200% of the distance L2 between the first power vias 114 in the second direction D2 and may range from about 110% to 200% of the distance L3 between the first ground vias 116 in the second direction D2. In some embodiments, a distance between the first vias 110 may increase as a distance from an outer edge of the first die 100 decreases, when viewed in a plan view. For example, the distance L2 between the first power vias 114 in the second direction D2 and the distance L3 between the first ground vias 116 in the second direction D2 may increase as a distance from each of both ends of the first die 100 in the second direction D2 decreases, i.e., the spacing between the first power vias 114 and first ground vias 116, respectively, increases with closer proximity to a closest end of the first die 100. In addition, as described above, the distance L1 between the first region R1 and the second region R2 adjacent to each other may increase as a distance from the signal region SR in the first direction D1 increases.

Furthermore, in some embodiments, the distance L1 between the first region R1 and the second region R2 adjacent to each other may be greater than the distance L4 between the first power vias 114 in the first direction D1 in one of the first regions R1 and the distance L5 between the first ground vias 116 in the first direction D1 in one of the second regions R2.

When stacking the dies 100 and 200, the vias 114 and 116 of the first and second regions R1 and R2 in which interconnection lines for different signals are provided, the lines may not be connected to each other due to the aforementioned arrangement of the vias. This will be described below in detail together with the process of stacking the second dies 200 on the first die 100.

The first die 100 may include external terminals 104. The external terminals 104 may be provided on the bottom surface of the first die 100. The external terminals 104 may be disposed under the first vias 110. The external terminals 104 may be electrically connected to the first circuit layer 102 and the first vias 110.

Even though not shown in the drawings, the first die 100 may further include a protective layer (not shown). The protective layer (not shown) may be disposed on the bottom surface of the first die 100 to at least partially cover the first circuit layer 102. The first circuit layer 102 may be protected by the protective layer (not shown). The protective layer (not shown) may include a silicon nitride (SiN) layer. The protective layer (not shown) may be configured to expose the external terminals 104.

In some embodiments, when the first ground vias 116 of which the number is more than the number of the first power vias 114 are configured in the first die 100, the number of the rows of the first ground vias 116 of the second region R2 may be more than the number of the row(s) of the first power vias 114 of the first region R1. As illustrated in FIG. 2D, the first power vias 114 may be arranged in a single row along the second direction D2 in each of the first regions R1. The first ground vias 116 may be arranged in two rows along the second direction D2 in each of the second regions R2. Unlike FIG. 2D, the first ground vias 116 may be arranged in three or more rows in the second region R2. In other embodiments, the first power vias 114 may be arranged in two or more rows in the first region R1, and the first ground vias 116 may be arranged in rows, of which the number is more than the number of the rows of the first power vias 114, in the second region R2.

Referring to FIGS. 1, 3A and 3B, a second die 200 may be provided. The second die 200 may include electronic elements, such as transistors. For example, the second die 200 may be a semiconductor die in a wafer level, which is formed of a semiconductor material, such as silicon (Si). A width of the second die 200 may be less than a width of the first die 100.

The second die 200 may include a signal region SR located in a central portion of the second die 200, a peripheral region PGR bordering or at least partially surrounding the signal region SR, and a dummy region DR bordering or at least partially surrounding the peripheral region PGR, when viewed in a plan view. The signal region SR, the peripheral region PGR and the dummy region DR of the second die 200, respectively, may have substantially the same shapes as those of the first die 100. Hereinafter, the regions of the second die 200, which are represented by the same names or labels as those of the first die 100, will be described as regions of the second die 200 on which the regions of the first die 100 are projected. The peripheral region PGR may include first regions R1 and second regions R2 which are disposed at each side in the first direction D1 of the signal region SR. The first regions R1 and the second regions R2 may be alternately arranged in the first direction D1. A distance between the first region R1 and the second region R2 adjacent to each other may increase as a distance from the signal region SR in the first direction D1 increases.

The second die 200 may include a second circuit layer 202 and second vias 210.

The second circuit layer 202 may be provided on a bottom surface of the second die 200. The second circuit layer 202 may include an integrated circuit. For example, the second circuit layer 202 may include a memory circuit, a logic circuit, or a combination thereof. In other words, the bottom surface of the second die 200 may be an active surface.

The second vias 210 may penetrate the second die 200 in the third direction D3. The second vias 210 may be electrically connected to the second circuit layer 202. The second vias 210 may have substantially the same components and arrangement as the first vias 110. The second vias 210 may include second signal vias 212 provided in the signal region SR, second power vias 214 provided in the first regions R1, and second ground vias 216 provided in the second regions R2. In other words, the arrangement of the second signal vias 212, the second power vias 214, and the second ground vias 216 may be substantially the same as the arrangement of the first signal vias 112, the first power vias 114, and the first ground vias 116 when viewed in a plan view. The second power vias 214 and the second ground vias 216 may be grouped.

The second power vias 214 may be arranged in multiple rows along the second direction D2 in one of the first regions R1. For example, as illustrated in FIG. 3B, the second power vias 214 may be provided in a grid form. In other embodiments, when the first power vias 114 of the first die 100 are provided in the zigzag form as illustrated in FIG. 2C, the second power vias 214 of the second die 200 may be disposed to correspond to the first power vias 114 when viewed in a plan view. For example, the rows, each of which includes the second power vias 214 arranged in the second direction D2, may be shifted or offset from each other in the second direction D2.

In certain embodiments, when the number of the rows of the first ground vias 116 of the second region R2 is more than the number of the row(s) of the first power vias 114 of the first region R1 as illustrated in FIG. 2D, the second power vias 214 of the second die 200 may be disposed to correspond to the first power vias 114 when viewed in a plan view. In detail, the number of the rows of the second ground vias 216 of the second region R2 may be more than the number of the row(s) of the second power vias 214 of the first region R1. For example, the second power vias 214 may be arranged in a single row along the second direction D2 in one of the first regions R1, and the second ground vias 216 may be arranged in multiple rows along the second direction D2 in one of the second regions R2.

The second ground vias 216 may be arranged in multiple rows along the second direction D2 in one of the second regions R2. For example, as illustrated in FIG. 3B, the second ground vias 216 may be provided in a grid form. In other embodiments, the rows, each of which includes the second ground vias 216 arranged in the second direction D2, may be shifted or offset from each other in the second direction D2.

Similar to the descriptions of the distance between the first vias 110, a distance between the second vias 210 may increase as a distance from an outer edge of the second die 200 decreases, when viewed in a plan view. For example, the distance between the second power vias 214 and the distance between the second ground vias 216 may increase as a distance from each of both ends of the second die 200 in the second direction D2 decreases, i.e., the spacing between the second power vias 214 and second ground vias 216, respectively, increases with closer proximity to a closest end of the second die 200.

The second die 200 may include connection terminals 204. The connection terminals 204 may be provided on the bottom surface of the second die 200. The connection terminals 204 may be disposed under the second vias 210. The connection terminals 204 may be provided on the second circuit layer 202 provided on the bottom surface of the second die 200 or pads 208 connected to bottom surfaces of the second vias 210. Each of the connection terminals 204 may include a micro bump. The connection terminals 204 may be electrically connected to the second circuit layer 202 and the second vias 210.

Some of the connection terminals 204 may be provided on the dummy region DR to function as dummy bumps. Hereinafter, the connection terminals 204 provided on the dummy region DR are referred to as dummy terminals 206. The dummy terminals 206 may be electrically insulated from the second vias 210. The dummy terminals 206 may be disposed on the first die 100 to support an edge portion of the second die 200 and may adhere the second die 200 to the first die 100.

In some embodiments, the dummy terminals 206 of the connection terminals 204, which function as the dummy bumps, may not be provided. In other words, the connection terminals 204 may not be provided on the pads 208 of the second circuit layer 202 on the dummy region DR. Hereinafter, the pads 208 provided on the dummy region DR are referred to as dummy pads 209. An adhesive layer 310 may at least partially fill a space between the dummy pads 209 of the second die 200 and another second die 200 (or the first die 100) disposed thereunder.

Referring to FIGS. 1, 4A, and 4B, the second die 200 may be mounted on the first die 100.

In other words, the second die 200 and the first die 100 may form a chip-on-wafer (COW) structure. For example, the connection terminals 204 may be adhered to the bottom surface of the second die 200, and the second die 200 may be mounted in such a way that the bottom surface of the second die 200 faces a top surface of the first die 100. The second die 200 may be aligned on the first die 100 in such a way that the connection terminals 204 are located between the first vias 110 and the second vias 210. The second die 200 may, however, be misaligned with the first die 100 in some examples. For example, the second die 200 may be disposed to tilt or twist with respect to the first die 100. In this example, the first vias 110 may be misaligned with the second vias 210. This may be due to a mechanical error by a process apparatus. FIG. 4B illustrates an example of misalignment. In FIG. 4B, the second die 200 may be twisted with respect to the first die 100 at a certain angle along a direction defined by an arrow TA of FIG. 4B about an axis parallel to the third direction D3.

In this example, a degree of misalignment between the first vias 110 and the second vias 210 may increase as a distance from a center of the twist, i.e., an axis about which the twist is generated, increases. For example, a degree of misalignment between the first and second signal vias 112 and 212 disposed in the central portions of the first and second dies 100 and 200, e.g., near the twist axis, may be relatively small, and degrees of misalignment between the first and second power vias 114 and 214 and between the first and second ground vias 116 and 216 disposed in outer portions of the first and second dies 100 and 200, e.g., farther away from the twist axis, may be relatively great.

Figure 4C:
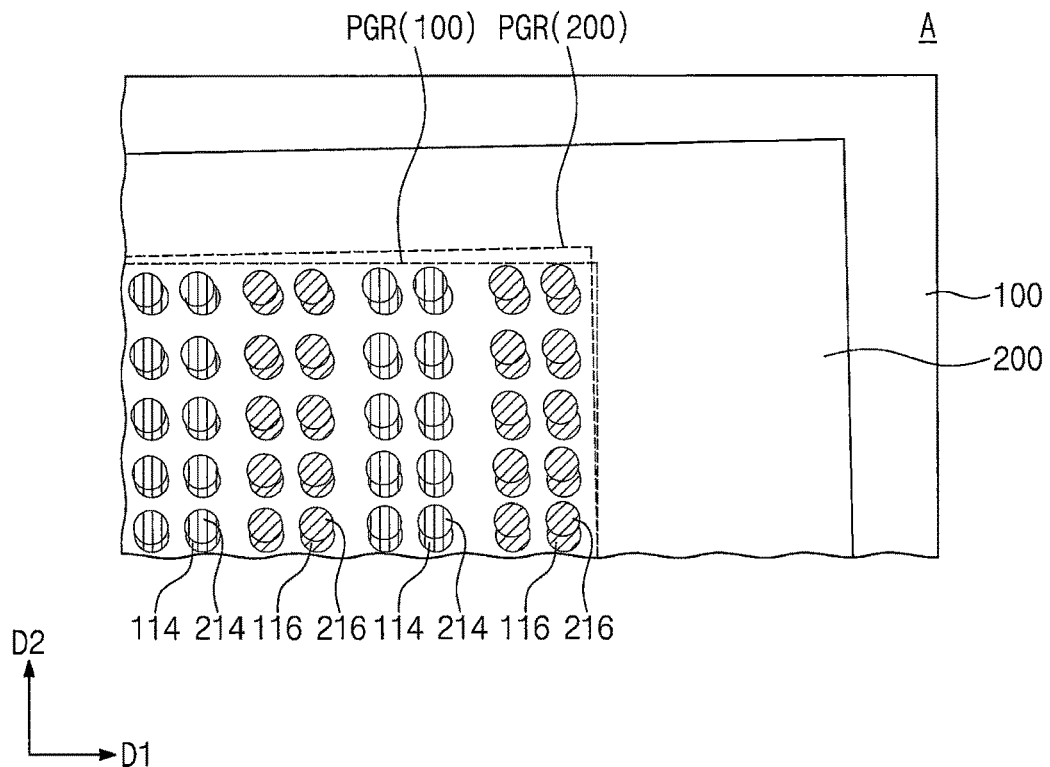
FIGS. 4C to 4E are enlarged plan views illustrating alignment of a first die and a second die.
Figure 4D:
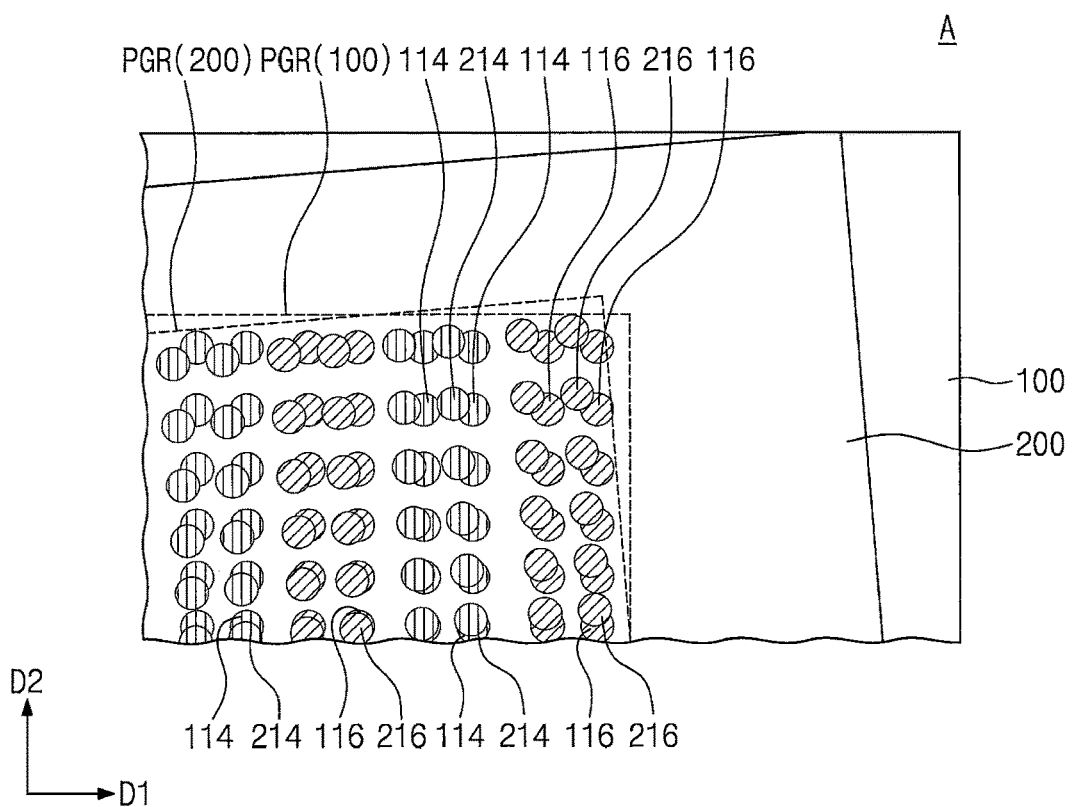

FIGS. 4C and 4D are views illustrating alignment of the first and second dies 100 and 200 and are enlarged views of partial regions A of the peripheral regions PGR located in the outer portions of the first and second dies 100 and 200. FIGS. 4C and 4D illustrate overlap of the vias of the first and second dies 100 and 200.

Referring to FIG. 4C, as described above, the distance between the first vias 110 and the distance between the second vias 210 may increase as the distances from the outer edges of the first and second dies 100 and 200 decrease. In detail, the distance between the first region R1 and the second region R2 adjacent to each other may increase as a distance from the signal region SR in the first direction D1 increases, and the distance between the first vias 110 and the distance between the second vias 210 may increase as the distances from the both ends of the first and second dies 100 and 200 in the second direction D2 decrease. Thus, each of the second vias 210 may not be in contact with another first via 110 adjacent to the first via 110 corresponding thereto. In other words, according to the embodiments of the inventive concepts, contact and a bridge of the vias 110 and 210 by the misalignment between the first and second dies 100 and 200 may be reduced or prevented, and an electrical short between the first and second dies 100 and 200 may not occur.

FIG. 4D illustrates an example in which the second die 200 is twisted at a great angle with respect to the first die 100. In this case, as illustrated in FIG. 4D, the first and second dies 100 and 200 may be twisted with respect to each other, and, thus, the second vias 210 may be in contact with other first vias 110 adjacent to the corresponding first vias 110.

According to the embodiments of the inventive concepts, the power vias 114 and 214 and the ground vias 116 and 216 may be grouped. In detail, the groups (or, the first regions R1 and the second regions R2) may be alternately arranged in the first direction D1 away from centers of the first and second dies 100 and 200, and the vias 114, 116, 214, or 216 may be arranged in multiple rows in the second direction D2 in each of the groups. Thus, the contact and/or bridge of the vias 114, 116, 214, and 216 may occur in the same group. For example, one of the second ground vias 216 may be in contact with both the first ground via 116 corresponding thereto and another first ground via 116 adjacent to the corresponding first ground via 116 or may form a bridge between the corresponding first ground via 116 and the adjacent first ground via 116. However, the same ground signal may be transmitted to the first ground vias 116. Thus, even though the second ground via 216 is connected to other first ground via(s) 116 adjacent to the corresponding first ground via 116, the ground signal transmitted to the second die 200 may be the same as a ground signal when the first and second dies 100 and 200 are aligned with each other. In other words, according to the embodiments of the inventive concepts, electrical failures may be reduced or minimized when stacking the second die 200 on the first die 100.

The contact of the ground vias 116 and 216 has been described above as an example. However, the second power via 214 may also be in contact with both a corresponding first power via 114 and another first power via 114 adjacent to the corresponding first power via 114 or may form a bridge between the corresponding first power via 114 and the adjacent first power via 114 when the second die 200 is misaligned with the first die 100. Even though the second power via 214 is connected to other first power via(s) 114 adjacent to the corresponding first power via 114, a power signal transmitted to the second die 200 may be the same as a power signal when the first and second dies 100 and 200 are aligned with each other.

Figure 4E:
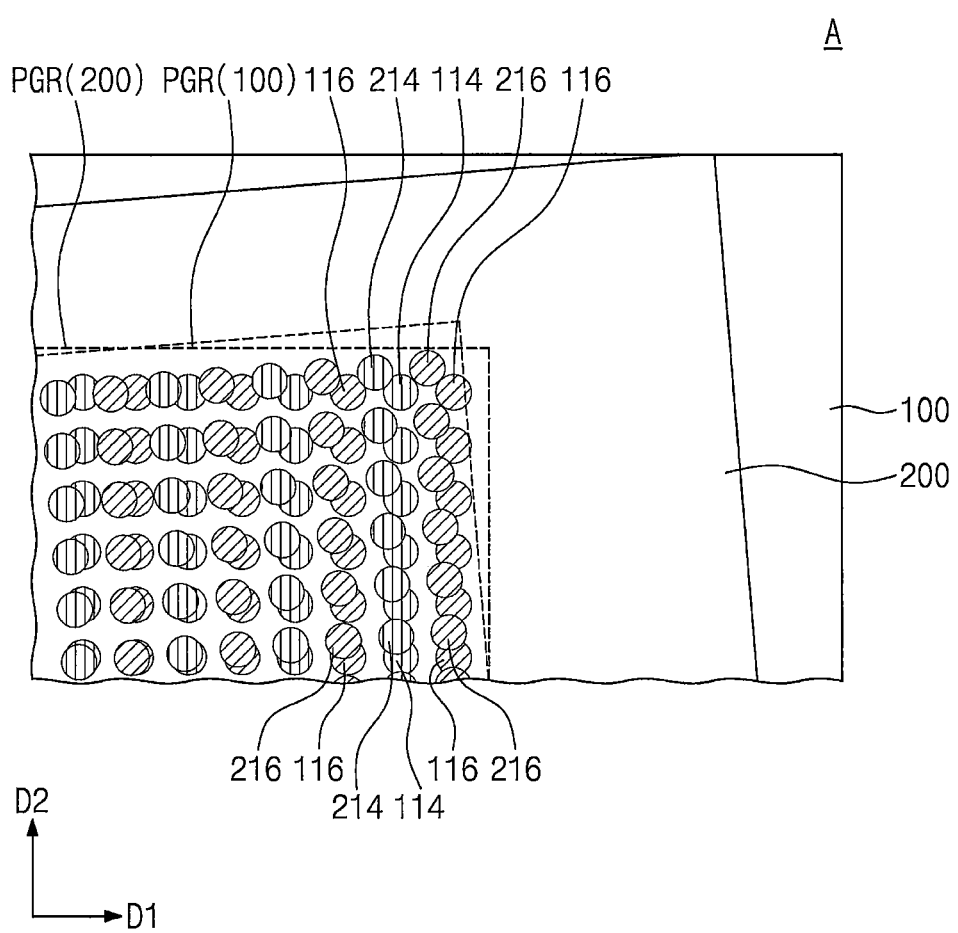

Generally, power vias 114 and 214 and ground vias 116 and 216 may be alternately arranged in the first direction D1 away from the signal region SR. FIG. 4E illustrates misalignment of first and second dies 100 and 200 when the power vias 114 and 214 and the ground vias 116 and 216 are alternately arranged in the first direction D1. If the first vias 110 and the second vias 210 are configured as shown in FIG. 4E, the first power via 114 may be in contact with the second ground via 216 or the first ground via 116 may be in contact with the second power via 214 when the second die 200 is misaligned with the first die 100. If the ground vias 116 and 216 are in contact with the power vias 114 and 214 for transmitting different signals from those intended for the ground vias 116 and 216, an electrical short may occur and electrical failure of a semiconductor package may occur. In other words, if the ground vias 116 and 216 and the power vias 114 and 214 are not grouped or arranged in a single row, unlike the embodiments of the inventive concepts, electrical failure may occur in misalignment of the first and second dies 100 and 200.

Referring to FIG. 5, a plurality of second dies 200 may be stacked on the first die 100. Here, an uppermost one of the plurality of second dies 200 may not include the second via 210. The plurality of second dies 200 may be electrically connected to each other through connection terminals 204 provided on their bottom surfaces. The connection terminals 204 may connect second vias 210 of the second dies 200 located adjacent thereto in the third direction D3.

Alignment of the second vias 210 of the second dies 200 adjacent to each other in the third direction D3 may be the same as the alignment of the first and second dies 100 and 200 described with reference to FIGS. 4A to 4C. For example, the second dies 200 may be misaligned with each other in some examples.

A distance between the second vias 210 may increase as a distance from an outer edge of the second die 200 decreases. Thus, each of the second vias 210 may not be in undesired contact with another second via 210 adjacent to the respective second via 210. In other words, according to the embodiments of the inventive concepts, undesired contact and/or a bridge of the second vias 210 by misalignment of the second dies 200 may be reduced or prevented and an electrical short between the second dies 200 may be reduced or prevented.

The second power vias 214 and the second ground vias 216 may be grouped. Thus, the contact and/or bridge of the second vias 210 may occur in the same group. For example, the same ground signal may be transmitted to the second ground vias 216. Thus, even though the second ground via 216 is connected to other second ground via(s) 216 adjacent to the corresponding second ground via 216, the ground signal transmitted to the second dies 200 may be the same as the ground signal when the second dies 200 are aligned with each other. In other words, according to the embodiments of the inventive concepts, electrical failures may be reduced or minimized when stacking the second dies 200.

Referring again to FIG. 1, an adhesive layer 310 may be provided between the dies 100 and 200. The adhesive layer 310 may include a fluid adhesive member or a non-conductive film (NCF). For example, the adhesive layer 310 may be a polymer tape including an insulating material. The adhesive layer 310 may be disposed between the connection terminals 204 to reduce the likelihood of or prevent an electrical short from occurring between the connection terminals 204. For example, solder balls (not shown) and an adhesive material (not shown) may be adhered to the bottom surface of the second die 200 before mounting the second die 200, and then, the second die 200 may be mounted in such a way that the bottom surface of the second die 200 faces the top surface of the first die 100. In other embodiments, the plurality of second dies 200 may be mounted through the same method as the mounting method described above. In some embodiments, an underfill layer, not the adhesive layer, may be provided between the dies 100 and 200.

A mold layer 320 may be formed on the top surface of the first die 100. The mold layer 320 may at least partially cover the top surface of the first die 100. The mold layer 320 may border or at least partially surround the second dies 200 when viewed in a plan view. The mold layer 320 may include an insulating polymer material. For example, the mold layer 320 may include an epoxy molding compound (EMC).

Thereafter, the carrier substrate 400 and the carrier adhesive layer 410 may be removed. The protective layer (not shown) and the external terminals 104 of the first die 100 may be exposed by the removal of the carrier substrate 400 and the carrier adhesive layer 410.

A semiconductor package, according to some embodiments of the inventive concepts, may be manufactured by the processes described above.

In the semiconductor package according to the embodiments of the inventive concepts, the distance between the vias may increase as a distance from the outer edge of the die decreases, and the vias for transmitting the same electrical signal may be grouped. Thus, undesired contact and/or bridge of the vias, e.g., contact/bridge of power vias with ground vias, by misalignment of the stacked dies may not occur, and electrical shorts between stacked dies may be reduced or prevented.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
a first die comprising a signal region and a peripheral region bordering the signal region, the first die having first vias in the peripheral region;
a second die stacked on the first die and having second vias at positions corresponding to the first vias in the peripheral region; and
first connection terminals between the first die and the second die that are configured to connect the second vias to the first vias, respectively,
wherein the peripheral region comprises first regions and a second region between the first regions, the first and second regions being arranged in a first direction at a side of the signal region,
wherein the first vias are arranged in at least two rows along a second direction intersecting the first direction in each of the first and second regions,
wherein a distance in the first direction between the first and the second regions adjacent to each other is greater than a distance in the first direction between adjacent ones of the at least two rows, and
wherein the distance in the first direction between the first and second regions adjacent to each other increases as a distance from the signal region in the first direction increases.

2. The semiconductor package of claim 1, wherein the distance in the first direction between the first and second regions adjacent to each other ranges from about 110% to about 200% of the distance in the first direction between adjacent ones of the at least two rows.

3. The semiconductor package of claim 1, wherein the first vias in the first regions are configured to transmit a power signal, and
wherein the first vias in the second region are configured to transmit a ground signal.

4. The semiconductor package of claim 1, wherein the rows of the first vias, which are adjacent to each other, are offset with respect to each other in the second direction in each of the first and second regions.

5. The semiconductor package of claim 1, wherein a distance in the second direction between adjacent ones of the first vias in a same one of the at least two rows increases as a distance from an outer edge of the first die decreases, when viewed in a plan view.

6. The semiconductor package of claim 1, further comprising:
a plurality of second dies, wherein the second die is one of the plurality second dies, and
wherein the plurality of second dies are sequentially stacked, and the second vias of the second dies are connected to each other through second connection terminals provided between the second dies.

7. The semiconductor package of claim 1, wherein the first die further comprises a dummy region bordering the peripheral region, the semiconductor package further comprising:
dummy bumps between the first die and the second die on the dummy region and electrically insulated from the first vias and the second vias.

8. The semiconductor package of claim 7, wherein the dummy region is free of the first vias and the second vias.

9. A semiconductor package comprising:
a substrate comprising first regions and second regions alternately arranged in a first direction; and
dies stacked on the substrate,
wherein each of the dies comprises power vias in the first regions; and ground vias in the second regions,
wherein the power vias are arranged in multiple rows along a second direction intersecting the first direction in each of the first regions,
wherein the ground vias are arranged in multiple rows along the second direction in each of the second regions, and
wherein a distance in the second direction between adjacent ones of the power vias in a same one of the multiple rows and a distance in the second direction between adjacent ones of the ground vias in a same one of the multiple rows in each of the dies increase as a distance from an outer edge of each of the dies decreases, when viewed in a plan view.

10. The semiconductor package of claim 9, wherein the rows of the power vias, which are adjacent to each other, are offset with respect to each other in the second direction in the first regions, and
wherein the rows of the ground vias, which are adjacent to each other, are offset with respect to each other in the second direction in the second regions.

11. The semiconductor package of claim 9, wherein a distance in the first direction between the first and second regions adjacent to each other increases as a distance from the outer edge of the dies in the first direction decreases.

12. The semiconductor package of claim 9, wherein the distance in the first direction between adjacent ones of the multiple rows of the power vias in each of the first regions and the distance in the first direction between adjacent ones of the multiple rows of the ground vias in each of the second regions are each less than a distance in the first direction between the first and second regions adjacent to each other.

13. The semiconductor package of claim 9, wherein the distance in the second direction between the adjacent ones of the power vias in the same one of the multiple rows and the distance in the second direction between the adjacent ones of the ground vias in the same one of the multiple rows increase as a distance from the outer edge of the dies in the second direction decreases.

14. The semiconductor package of claim 9, wherein the substrate further comprises a third region,
wherein the third region overlaps a central portion of the die when viewed in a plan view, and
wherein the first regions and the second regions are arranged in the first direction at a side of the third region.

15. The semiconductor package of claim 14, wherein the dies further comprise signal vias in the third region, and
wherein a distance in the first direction between adjacent ones of the signal vias is less than a distance in the first direction between adjacent ones of the power vias in different ones of the multiple rows or the distance in the second direction between the adjacent ones of the power vias in the same one of the multiple rows; and
wherein the distance in the second direction between adjacent ones of the signal vias is less than the distance in the first direction between the adjacent ones of the power vias in the different ones of the multiple rows or the distance in the second direction between the adjacent ones of the ground vias in the same one of the multiple rows.

16. The semiconductor package of claim 14, wherein the substrate further comprises a dummy region bordering the third region, the first regions, and the second regions, and
wherein the dies further comprise dummy bumps on a bottom surface of each of the dies on the dummy region.

17. A semiconductor package comprising:
a substrate; and
dies vertically stacked on the substrate,
wherein each of the dies comprises first vias and second vias, which vertically penetrate each of the dies,
wherein the first vias are in a first region of the substrate, and the first vias are arranged in at least two rows along a second direction intersecting a first direction,
wherein the second vias are in a second region of the substrate, which is spaced apart from the first region in the first direction, and the second vias are arranged in at least two rows along the second direction,
wherein a distance in the first direction between the first and second regions adjacent to each other ranges from about 110% to about 200% of a distance in the first direction between adjacent ones of the at least two rows of the first vias and ranges from about 110% to about 200% of a distance in the first direction between adjacent ones of the at least two rows of the second vias.

18. The semiconductor package of claim 17, wherein a distance in the second direction between adjacent ones of the first vias in a same one of the at least two rows increases from a central portion of the first region toward an end of the first region, and
wherein a distance in the second direction between adjacent ones of the second vias in a same one of the at least two rows increases from a central portion of the second region toward an end of the second region.

19. The semiconductor package of claim 17, wherein the substrate comprises a first circuit and a second circuit,
wherein the first vias are connected to the first circuit, and
wherein the second vias are connected to the second circuit.

* * * * *